(12) United States Patent  (10) Patent No.: US 8,716,889 B2
Vaidyanathan  (45) Date of Patent: May 6, 2014

(54) SOLAR POWERED ELECTRICAL GENERATION DEVICE AND RELATED METHODS

(76) Inventor: Chandramouli Vaidyanathan, Eagan, MN (US)

(*) Notice: Subject to any disclaimer, the term of this patent is extended or adjusted under 35 U.S.C. 154(b) by 295 days.

(21) Appl. No.: 13/216,376

(22) Filed: Aug. 24, 2011

(65) Prior Publication Data

US 2011/0308574 A1 Dec. 22, 2011

Related U.S. Application Data

(60) Provisional application No. 61/452,529, filed on Mar. 14, 2011.

(51) Int. Cl.
*H02J 1/10* (2006.01)

(52) U.S. Cl.
USPC .......................................................... 307/43

(58) Field of Classification Search
CPC ............ H02J 1/10; H02S 10/00; H02S 20/00; H02S 40/00
USPC .......................................................... 307/43
See application file for complete search history.

(56) References Cited

U.S. PATENT DOCUMENTS

| | | | |
|---|---|---|---|
| 4,063,963 A | 12/1977 | Bond, Jr. | |
| 5,949,150 A * | 9/1999 | MacDonald | 307/10.1 |
| 6,255,805 B1 | 7/2001 | Papalia et al. | |
| 6,268,559 B1 * | 7/2001 | Yamawaki | 136/244 |
| 6,978,931 B2 | 12/2005 | Brobeck | |
| 7,141,321 B2 | 11/2006 | McArthur et al. | |
| 7,352,076 B1 | 4/2008 | Gabrys | |
| 7,379,997 B2 | 5/2008 | Ehlers et al. | |
| 7,430,459 B1 | 9/2008 | Papalia et al. | |
| 7,512,540 B2 | 3/2009 | Gluck et al. | |
| 7,516,106 B2 | 4/2009 | Ehlers et al. | |
| 7,590,472 B2 | 9/2009 | Hakim et al. | |
| 7,738,999 B2 | 6/2010 | Petite | |
| 8,102,144 B2 * | 1/2012 | Capp et al. | 320/101 |
| 8,207,637 B2 * | 6/2012 | Marroquin et al. | 307/147 |
| 8,254,090 B2 * | 8/2012 | Prax et al. | 361/641 |
| 8,269,374 B2 * | 9/2012 | De Caires | 307/82 |
| 2004/0221886 A1 | 11/2004 | Oono | |
| 2011/0012429 A1 * | 1/2011 | Fornage | 307/82 |
| 2011/0077786 A1 | 3/2011 | Vaidyanathan | |
| 2011/0132353 A1 * | 6/2011 | Gumm et al. | 126/680 |

OTHER PUBLICATIONS

SunPods Solar Products description, http://www.sunpods.com/sunpods-products-and-solutions.html, 2 pgs., Aug. 18, 2011.

* cited by examiner

*Primary Examiner* — Hal Kaplan
(74) *Attorney, Agent, or Firm* — Billion & Armitage; Benjamin C. Armitage

(57) ABSTRACT

Embodiments relate to a solar electrical power generation device, including one or more prefabricated solar photovoltaic power source units each unit including an adapter to electrically connect to other units, a moveable and adjustable frame supporting at least one of the one or more prefabricated solar photovoltaic power source units and an electrical storage device being capable of storing electrical power generated from the one or more power source units. The frame is moveable from between sites and within a site and adjustable to increase or decrease a unit angle in relation to the sun and wherein the device being capable of connecting to a utility grid or serving as a stand-alone electrical power system.

17 Claims, 9 Drawing Sheets

SOLAR POWERED ELECTRICAL GENERATION DEVICE AND RELATED METHODS

PRIORITY OF INVENTION

This non-provisional claims the benefit under 35 U.S.C. 119 to provisional application No. 61/452,529, titled SOLAR ORIENTED SEMI-MOBILE GENERATION UNIT, filed on 14 Mar. 2011, which is hereby incorporated by reference for any purpose.

FIELD

This invention is directed to electrical power generation systems connected to an electric utility grid and stand alone power generation using solar photovoltaic energy.

BACKGROUND

Electrical power generation units, for example renewable energy systems such as solar photovoltaic systems, may be connected to an electrical utility grid and also be stand alone power generation, and may provide power to the utility grid. Customers can purchase solar photovoltaic systems, but require specialists to design and install the system. The solar installer designs the system integrating the solar photovoltaic panel, inverter and mounting elements for each individual facility. Subsequently, the installer or subcontractor usually labor installs the system. The solar photovoltaic power generation system may exhibit large variations in design, install and cost of the system at the facility because of area, interconnection, sighting and accessibility, as well as installation costs. Most solar system installations have considered mostly gabled roof tops as locations for the solar system installation. Due to gabled roof orientation being inappropriate for solar orientations at the facility, these facilities may be deemed insufficient for solar power generation. Solar units that are mounted on the ground or flat roof can be oriented to face the sun and can be integrated as part of the ground landscape. If changes or expansion of the system becomes necessary, the installer must re-design or make labor-intensive modifications and calculations to adjust the system to the current needs.

SUMMARY

Embodiments of the present invention relate to a solar electrical power generation device, including one or more prefabricated solar photovoltaic power source units, each unit can include an adapter to electrically connect to other units, a moveable and adjustable frame supporting at least one of the one or more prefabricated solar photovoltaic power source units and an electrical storage device being capable of storing electrical power generated from the one or more power source units. The frame can be moveable from between sites and within a site. The frame can be adjustable to increase or decrease a unit angle in relation to the sun. The units can be capable of connecting to a utility grid or serving as a stand-alone electrical power system, e.g., off the utility grid. In an example, a prefabricated device can mean a standard, single type of device.

Embodiments also relate to a method for generating solar electrical power, including selecting one or more prefabricated solar photovoltaic power source units, positioning the one or more prefabricated solar photovoltaic power source units on a moveable and adjustable frame, electrically connecting the one or more prefabricated solar photovoltaic power source units to one or more of a utility grid, residence, commercial business or electrical storage device and generating solar electrical energy and distributing the energy to one or more of a utility grid, residence, commercial business or electrical storage device.

Embodiments also relate to a method for ordering and designing a site installation of solar electrical power devices as a system for a site. The method can select one or more prefabricated solar photovoltaic power source units, position the one or more prefabricated solar photovoltaic power source units at the site, e.g., on a moveable and adjustable frame or permanently installed. The method can designate which device is positioned where and provide a layout of the devices inclusive of position and order of installation. In an example, the order of how the power devices are connected to one another in a serial layout or parallel layout with a single electrical output to the load. The method can be used at short-term sites in response to emergency conditions, such as national disasters or military excursions. The method further can set forth how the one or more prefabricated solar photovoltaic power source units are electrically connected to one or more of a utility grid, residence, commercial business or electrical storage device and generating solar electrical energy and distributing the energy to one or more of a utility grid, residence, commercial business or electrical storage device or other energy consumer. The method can further rely on topographical information stored in a database to determine an installation layout. The method can also store the path of the sun and its angel of incidence through the time of day and the days of the year. A customer can be queried by the method, e.g., using a computing system, to input the desired location, the peak power desired, the time and date of peak power and for other pertinent information. The method can confirm at least some of this data input by a customer using data stored or at least accessible by the system.

Embodiments relate to a solar power module system including two or more solar power modules. Each module includes a prefabricated solar photovoltaic power source unit, an electrical adapter; and one or more controllers. Each module is capable of independently generating solar electrical energy and distributing the energy to a utility grid, as a stand-alone system or connecting to another module to form a larger generating system. While the solar power modules can be standardized, the layout of a plurality of solar power modules for an installation site can be individually designed.

DETAILED DESCRIPTION

Figure 1:
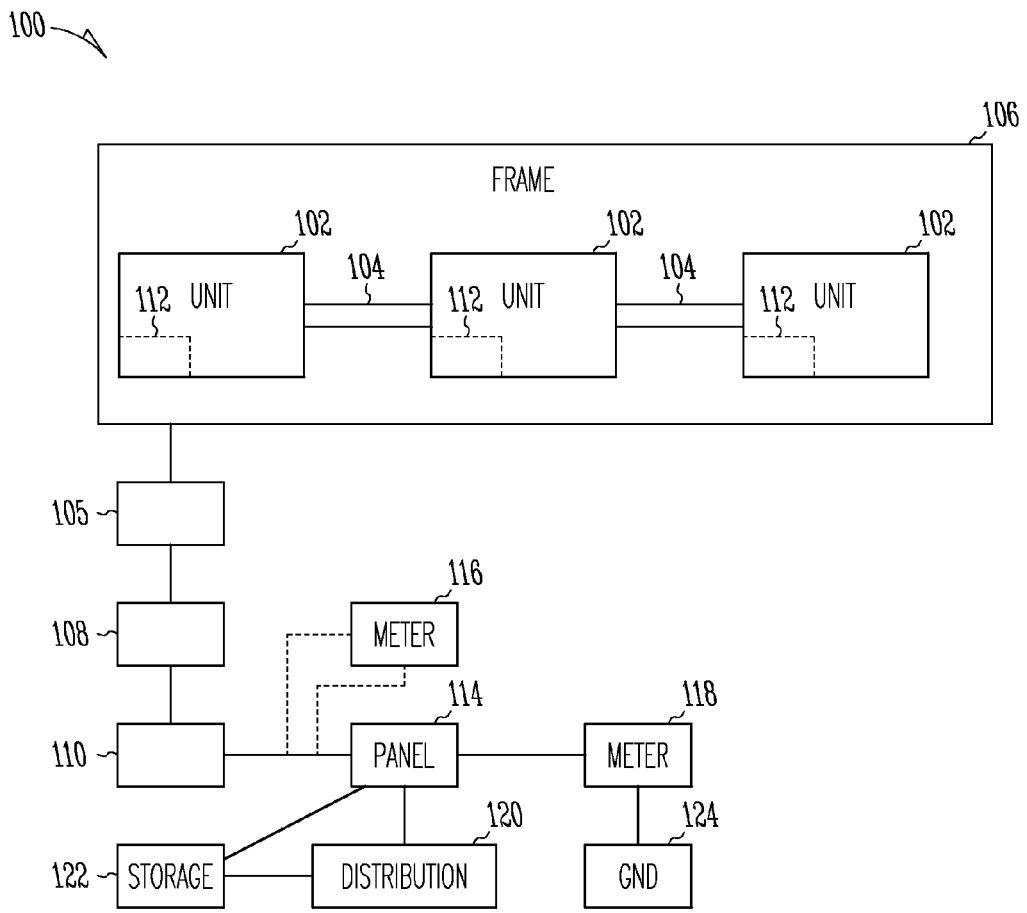
FIG. 1 depicts a schematic view of a solar electrical generation system, according to some embodiments.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention relate to modular, cost- and design-efficient solar power source units. Embodiments integrate the design and labor off site and deliver prefabricated modular units to the site. Such a design process can reduce installation costs. In an example, the units are of a standard design, e.g., a single design or a limited number (less than ten) designs for a standard installation by the present methods and systems described herein. Multiple units or modules can make up the solar generating system. These systems can be both grid connected and stand alone systems. The solar power units can be connected together to provide a single power output to a load. In an example, one solar power unit is a designated controller to control the output, e.g., signal matching, impedance matching, and control of the other solar power units.

An electrical power generation unit which is connected to an electrical utility grid may be coupled to an energy storage system. In solar photovoltaic power generation, orientation to the sun can be critical to the power generated in various examples. A solar power generating system includes solar module (or panel), inverter and mounting device. The solar power generating unit can be a standardized design, e.g., a single design for all installation layouts, a few designs for all layouts ("few" can be equal to or less than five or can be equal to or less than three). While the layout at an installation or for each facility is individually designed, the solar power generating unit is a single design or one of the few designs. The layouts of the generating system, as a whole, typically are not duplicated.

Embodiments of the present invention utilize prefabricated solar modular units, in combination with "quick coupled" or "plug and play" electrical connections between units. A single unit is self sufficient to be either grid connected or supply power through battery storage. Each unit can comprise an entire solar power solution or be quickly and easily combined to provide increased electrical output. Moreover, one of the solar modular units can operate as a master to the other units, which operate as slaves. The master unit can be the last in the connected chain of solar modular unit. All the components for power generation may be included in a single module, such as a quick connect to grid breakers, snow removal device, position change for solar orientation, tilting mechanism for optimum solar orientation, storage, inverter and solar panels. Each prefabricated solar unit is stand alone and has the elements of direct current power (DC Power) and alternate current power (AC Power) integrated that can be grid connected as well as standalone systems to power remote and independent facilities. The unit or module can be prefabricated to interact with a number of existing electrical configurations possibly present at a future installation facility or site. For example, the unit can be configured to interact with split phase 120/240V, 3-phase 208V or 3-phase 480/277V. A transformer may be utilized to achieve the adaptations on site. The modules can also include an identification code that forces one unit to be a master and the others to be the slaves to the master unit.

This invention is both portable and stationery. The portability can be made using a simple wheel and cart approach or trailer (wheels and hitch for pulling behind vehicle) or mounted on a truck bed to deliver to an installation site. The stationery configuration can be made using concrete foundation footings, anchors, ballasts and the likes. The deployable system harvests available solar and is highly adaptive and portable. Most renewable energy systems are developed with a precise location in mind and then designed for optimal harvesting potential for that specific location. This present invention standardizes the entire solar system and can be easily connected and deployed into buildings or traditional brick and mortar structures and also for Forward Operating Bases (FOBS) and Main Operating Bases (MOBs).

Referring to FIG. 1, a schematic view 100 of a solar electrical generation system is shown, according to some embodiments. One or more solar electrical power source units 102 are in electrical contact through connection 104, such as an adapter. The one or more units 102 may be supported by frame 106, such as a moveable and adjustable frame. The units 102 can be connected in series or in parallel, for example. Each unit may include its own dedicated controller 112, such as an inverter or a microinverter. In this embodiment, if one unit would malfunction or short out, the controller would prevent the entire string or system of units from going off-line. The units 102 may be connected to electrical control and regulation components, such as junction box 108 and optional inverter 110. The controller 112 can include electrical connections to output electrical power to solar panel maintenance device, e.g., snow removal devices, wipers, cleaners, communication devices, etc. Such an output can be DC power to power DC motors. With an installation of a plurality of units 102, the units 102 are connected together. In an installation, the units 102 are electrically connected to each other, e.g., a daisy chain or serial connection. The units 102 can be electrically connected together in a sequence or in a ring. In a further example, some units can be connected in sub-rings with each ring having a master device with such master devices connected together to an installation master unit that will output an electrical signal from the entire group of electrical power generating units 102. Other than a full, single loop, systems which contain internal loops cannot be called daisy chains. In another installation, the units 102 are connected linearly with the master unit being at an end of the line and connected to the power system at the installation site.

An optional meter 116 may be positioned between the electrical control devices and electrical panel 114 to monitor electrical generation. The electricity generated by the units 102 may be distributed 120 to the facility (e.g., home, dwelling, disaster relief center, business or military installation), to a utility grid 124 or to an electrical storage device 122. A meter 118 may be positioned in the system to measure electrical distribution to the utility grid 124.

The adapter 105 can be a quick coupling or connect mechanism, outlet or electrical wire and plug, for example. The unit comes with a quick connect mechanism which is an adapter (both female and male) that can be connected through conductors and grounding to utility grid systems. The unit can also be a stand alone system wherein there are outlets in the unit from which the loads can be supplied at the supply voltage and power. The adapter 105 can conform to rules for connection of the male and female pairs of the adaptors between units 102 and the other electrical connections. Such rules can force a one-way direction of flow of electrical power from one unit to the next unit until the final unit connects to an external electrical system. These adapter connection rules can also simplify the installation of the units 102 and improve safety. The adapter 105 can include a safety enclosure to prevent most people from accessing the electrical connections. The enclosure can further prevent weather from faulting the adapter connection.

The controller 112 can be one as described in U.S. Published Patent Application 2011/0012429, filed Sep. 13, 2010, which is herein incorporated by reference in its entirety. However if the material incorporated by reference conflicts with the present disclosure, the present disclosure controls interpretation of the present application. The controller 112 can include at least two power stages, each power stage of the at least two power stages capable of converting DC input power to DC output power; and a controller for dynamically selecting, based on a first DC power, one or more power stages of the at least two power stages for converting the first DC power to a second DC power, for example. The controller 112 can dynamically select a flyback mode from a plurality of flyback modes for operating the one or more power stages. The flyback mode may be selected based on an input voltage to the at least two power stages. Additionally, the plurality of flyback modes includes a regular flyback mode and a quasi-resonant flyback mode. The controller 112 can also include an output circuit coupled to the at least two power stages for converting the second DC power to AC power.

The controllers 112 of the units 102 can also include a code or identification that labels that controller as either a master device or a slave device. The master controller controls the output from the units 102 to the panel 114 or other load. The master controller can sample the electrical signal at the panel 114 or other load and match the electrical signal from the units 102 to the signal at the panel 114 or load. When the units 102 having the controller are connected together through the adapters, each controller can send its identification code through the connections. The master unit's controller 112 then registers each of the other units as connected in this installation, which can be a chain as described herein.

The controller 112 on the master unit can sense an output electrical waveform at the controller's adapter, which is the interface to the exterior electrical system. The waveform being sensed is the exterior electrical system waveform and can sense the voltage, frequency and/or the phase. The controller 112 can then establish a reference waveform that matches the sensed waveform. The controller 112 then controls an output current waveform of the units 112 (of the entire installation of units) that track the reference waveform. The controller 112 continues to sense the signal from the exterior electrical system and will revise the reference waveform and, hence its output waveform. If there is a significant difference in the reference waveform and the sensed waveform the controller can stop outputting an electrical waveform to reset the reference and maintain a match with the electrical signal to which the unit is connected.

The master controller 112 can establish a predetermined current, e.g., a current that will not exceed the rating of the connections, wires, lines, or the exterior electrical system. The output current of the electrical signal from the master controller 112 tracks the predetermined current. The voltage at the adapter that connects the controller to the exterior electrical system is sensed. If the sensed output voltage is outside a set voltage or waveform range, then electrical output from the master controller 112 is interrupted or disconnected from the exterior electrical system, e.g., the utility grid or the building electrical system. The master controller 112, after the output signal is interrupted, can resume output after a few cycles or seconds of the exterior electrical system. The controller 112 can also take into consideration appropriate regulatory requirements, after the grid is reconnected and a sinusoidal voltage is re-imposed at adapter of the master controller 112.

The controller 112 of the solar units 102 can further include other circuitry that operates to provide safety improvements. The circuitry can serve as a bypass circuit for electrical current through an individual solar unit from a second unit to a third unit, which are both electrically connected to the unit 102. The circuitry forms a parallel circuit relative to photovoltaic cells. The controller 112 can sense when a unit 102 is not supplying power and that unit can be bypassed and can send a request for service. In an example, the circuitry can include a power relay selecting between three positions, bypass, power from current photovoltaic cell only, and combining the electrical energy from upstream units 102 and the current unit and outputting same downstream.

Figure 2:
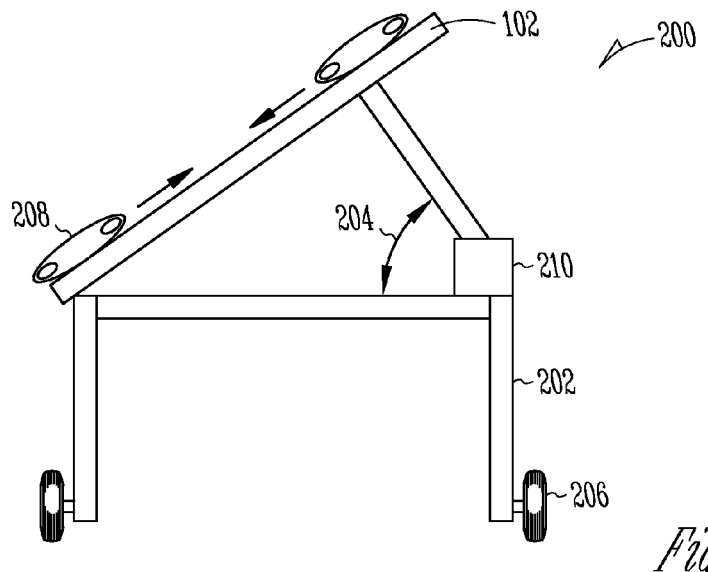
FIG. 2 depicts a perspective side view of a solar electrical generation device, according to some embodiments.

Referring to FIG. 2, a perspective side view 200 of a solar electrical generation device is shown, according to some embodiments. A power unit 102 can be mounted on frame 202. The frame 202 can be moveable, such as by utilizing wheels 206 or a trailer frame. A wheeled unit allows ease of delivery to a site as such a wheeled unit can be loaded on to a train bed or truck bed with ease. Wheeled units can also be moved by small vehicles such as trucks, tractors, ATVs, etc. A unit with wheels allows maneuverability at the installation site using common vehicles that can engage a frame, e.g., using a standard hitch connection. The frame 202 can also be weighted so that the device has sufficient weight hold the solar electrical energy producing device in the upright position as shown in FIG. 2. In an example, the legs that extend down to the ground hold over half the weight of the solar electrical energy producing device. The frame 202 can be a standardized frame that holds the photovoltaic panel. In an example, the frame 202 can be a fixed frame, which is unfolded or constructed from a kit sent to the installation site. The frame can include pipes, angle iron, box metal or rods. In an example, the frames are all of a single design to standardize the installation of the energy producing unit. The frame can be set in a direction facing the path of the sun, generally parallel to the south when the device is in the northern hemisphere. The angle 204 of the unit in relation to the sun may be adjusted by a tilting mechanism 210 integrated or attached to the frame 202 and connected to the energy generation panel. The tilting mechanism 210 can tilt the face of the photovoltaic panel, e.g., the array of cells, in at least one direction and in an example in two directions. The photovoltaic panel is typically planar and can be tilted in the X-axis, Y-axis, and/or Z-axis in various embodiments. The frame 202 can be set in a fixed position once adjusted or subsequently adjusted numerous times. A snow removal device 208 can be optionally integrated into the frame 202 or one or more power source units 102, for example.

Snow removal device 208 can be powered by a hand crank (e.g., a manually powered device). In an example, the snow removal device 208 operates automatically, e.g., non-manually. The snow removal device can be operated by wind power or electrical motor. The snow removal device 208 can be a blower that uses air flow or air pressure, e.g., compressed air, which removes snow from the face or the electricity-generating panel. The snow removal device 208 can be a mechanical snow remover, e.g., brush, wiper, bar, cloth or other configuration. If a wiper, brush, cloth or other similar device, the mechanism can move vertically along the face of the panel. In a specific example, the mechanism starts at the top of the panel and then moves vertically down the face of the panel and pushes the snow off the bottom of the panel. In a further example, the mechanism can move horizontally across the unit face to remove snow. A compressed air device can be positioned at one or more perimeters of the unit to force the snow in one or more directions, such as downward. In an example, a heater heats the air output by the blower such that heated air is used to remove the snow from the face of the panel. A heating device, such as heated tape, may be implemented around one or more of the perimeters of the unit to melt snow. Each snow removal device 208 can be powered directly from the local power grid or the local power system. In another example, the snow removal device 208 is be powered each unit's controller. The devices 208 can be powered by a system inverter, as an option. By operating the snow removal device, the snow is forced off the panels within a short duration of time. The snow removal device 208 can be mounted directly on one or more units 102 or on each frame 202, for example. The snow removal device 208 can be configured to remove snow without touching or scratching the unit face (i.e., panels), such as by brushing or wiping within about 1-2 mm of the surface, without physical contact with the face. In a further example, a track is mounted to the front face of the solar power generating devices and the snow removal devices can travel along the track to remove the snow. The track can be positioned along one edge of the unit so that the track and the snow removal device minimally, if at all, interfere with the sunlight impinging on the unit. In a further example, the track can extend off the front face of the unit to remove the snow removal device from the front face.

Figure 3A:
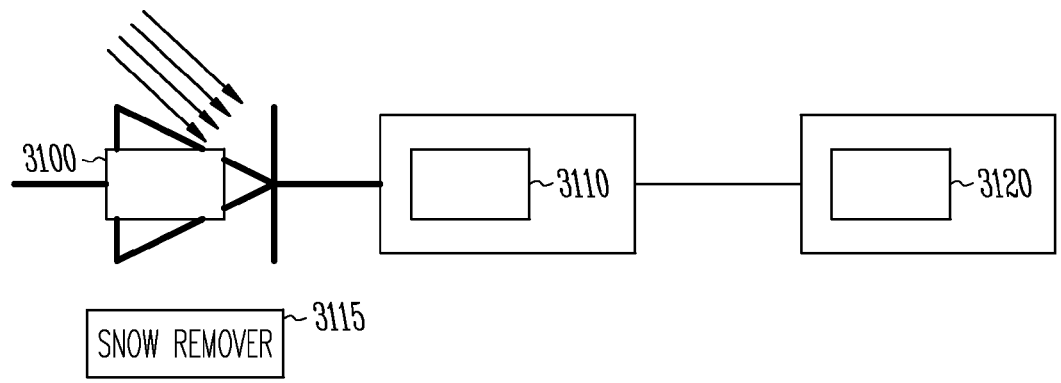
FIG. 3A depicts a prefabricated solar electrical power generation unit that is grid tied.

FIG. 3A depicts an electrical power generation unit formed according to an embodiment. The electrical power generation unit includes a solar module 3100, for example one or more solar photovoltaic panels, capable of generating electrical power. A means for converting electrical power to useable power 3110, depicted schematically in FIG. 3A as power source meter and switch 3110, is coupled to the solar photovoltaic modules 3100. In an example, the means for converting can also operate as master or slave device to control output of a plurality of electrical power generation units. A snow removal mechanism, which is battery operated, hand crank or a wind turbine mechanism to rotate the snow removal device, can be provided on the unit. Other examples of a snow removal device can be used in the FIG. 3A embodiment. The power source meter and switch 3110 is also referred to as the inverter device that converts the DC Power to AC Power.

The electrical power generation unit 3100 also includes an energy storage system, for example, a rechargeable battery 3130 (FIG. 3B) capable of storing electrical power delivered to the energy storage system as stored energy. Other examples for energy storage can also be used, e.g., a mechanical store, a flywheel, and/or a closed cycle fuel cell. The energy storage system 3130 is furthermore capable of delivering the stored energy in the form of electrical power. In one realization of the instant embodiment, the energy storage system 3130 can have a maximum capacity for the stored energy. In one realization of the instant embodiment, the energy storage system 3130 is capable of delivering a desired amount of electrical power up to a stored energy delivery rate limit. The delivery rate limit can be a function of the unit 3100, rate of battery output. In a further example, the rate limit is a function of the load or local power system.

Figure 3B:
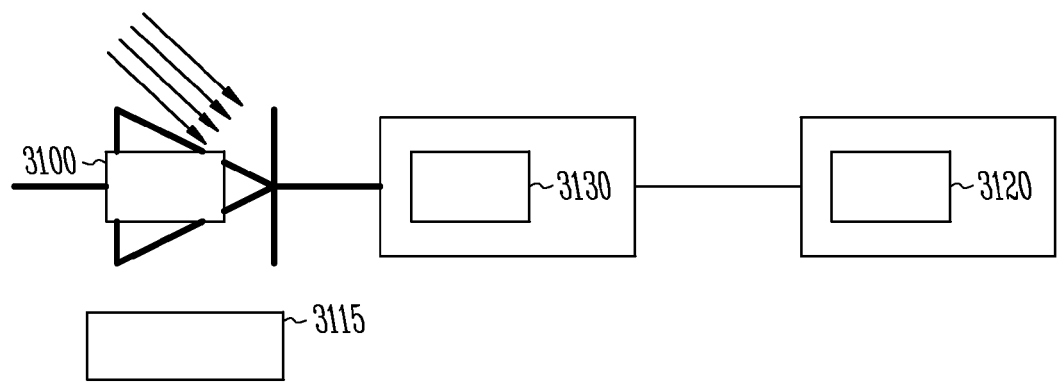
FIG. 3B depicts a prefabricated solar electrical power generation unit that is a stand alone system with storage
Figure 3C:
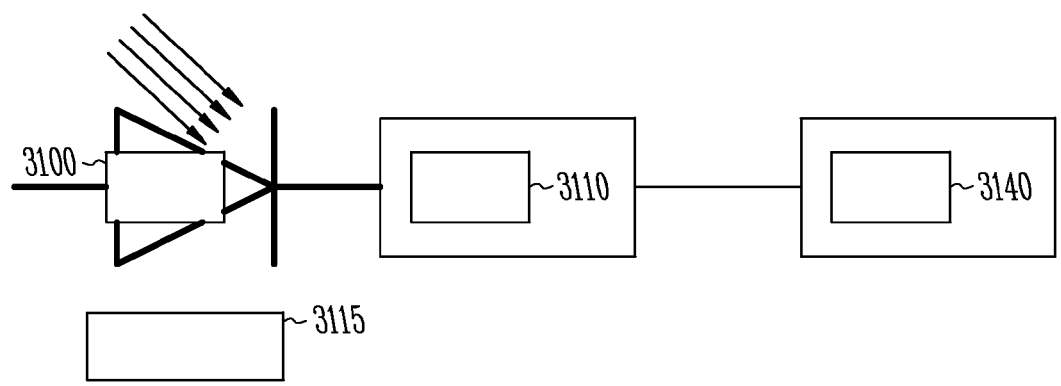
FIG. 3C depicts a prefabricated solar electrical power generation unit that has auxiliary power to simulate grid frequency so it can be placed in remote locations.

Electrical power can be delivered from the power source 3100 to an electrical utility grid 3120, depicted schematically in FIG. 3A and FIG. 3B as electrical utility conductor, through a generated power source meter and switch 3110. The generated power delivery switch 3110 is capable of controlling an amount of electrical power from the power source 3100 delivered to the electrical utility grid 3120. The power delivery switch can be part of a controller at a solar panel unit. The switch 3110 can be programmed to deliver a power signal that matches the power at the connection point, e.g., electrical power panel at a building or a utility power signal. In an example, the switch 3110 is programmed at a remote location prior to delivery of the power source 3100 to the installation site. The embodiment can also include a secondary power generator 3140 to aid in a simulated grid connected system as in FIG. 3C. The purpose of the secondary power generator is to supply grid frequency appropriate for the power source and switch 3110. In an example, the switch 3110 includes circuitry to sample the electrical signal to which it is connected and match the signal output from electrical power generation device, e.g., power source 3100. In a further embodiment, the switch is part of the master controller to control the output signal to a load. The slave type solar panel units can be without a switch.

The electrical power generation unit 3100 can also include a snow removal device 3115 that engages the surface of the photovoltaic panel to remove debris, such as snow, from the surface of the photovoltaic panel. The snow removal device 3115 can include a wiper that travels on the panel and can include a rubber blade that engages the surface. The wiper may include a cloth that engages the surface. The wiper can pivot from a single point, e.g., the bottom or side of panel. In another example, the wiper extends along then entire width of the panel. The wiper can travel down the photovoltaic panel to remove snow. In an example, the wiper is positioned so that it does not directly contact the surface of the panel but is closely adjacent face, e.g., within a ¼ inch. The snow removal device can, in an example, include a heat source, e.g., a heating tape or a blower that can blow warm air on the face of the photovoltaic panel. The snow removal device 3115 requires energy to operate. The energy can come from the controller. In another example, the power is supplied from a separate electrical circuit.

Figure 4:
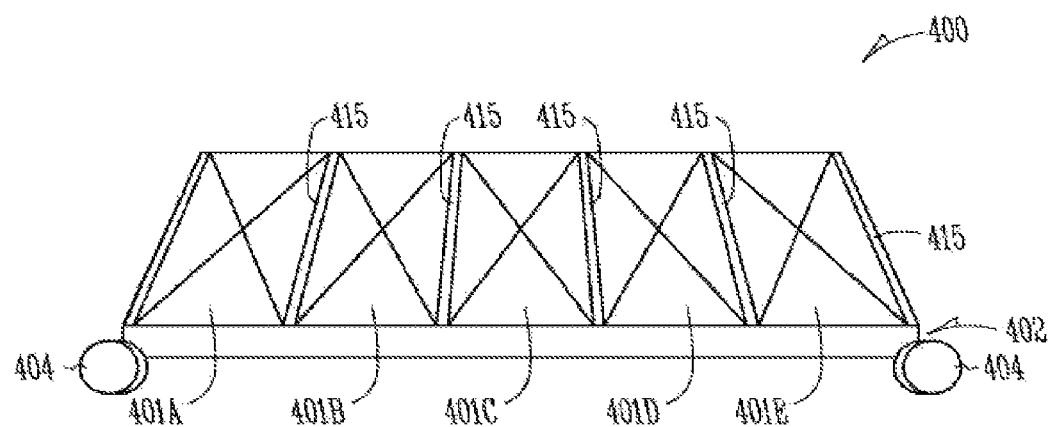
FIG. 4 depicts a rendition of the prefabricated unit that is manufactured in a manufacturing facility and is taken to the site for installation.

FIG. 4 shows an electrical power generation system 400 with a plurality of solar modules 401A, 401B, 401C, 401D, and 401E mounted to a frame 402. While shown as five solar modules 401A-401E, it will be within the scope of the present invention to provide a single solar module, e.g., 401A, or any plurality of solar modules. The solar modules 401A-401E are each connected to a controller (not shown in FIG. 4) to output electrical energy, either as direct current or alternating current, preferably in phase with standard utility power or standard building power. The frame 402 can be mobile to orient the solar modules 401A-401E to the position of the sun to increase the efficiency of the generation of electricity from solar energy. In an example, the angle of the front face of the solar module relative to the vertical should be in a range of about 22 degrees to about 68 degrees in Minneapolis, Minn. In Anchorage Ak., the angle of the front face of the solar module relative to vertical should be in a range of about 6 degrees to about 52 degrees. Depending on the performance desired from the system 400, the angle of the modules 401A-401E can be set for a specific month when energy needs would be greatest. The frame 402 can include members that support the solar modules 401A-401E and are connected to actuators that move the position of the solar modules 401A-401E to track the position of the sun. The frame 402 further includes wheels 404 that allow the system 400 to be moved into place. The wheels 404 can be locked once the system 400 is in place at its generation location. In a further example, the wheels 404 are removed once the system 400 is positioned in place.

A snow removal device 415 is positioned on the electrical power generation system 400. In the illustrated example, a snow removal device 415 is positioned along a longitudinal side of each solar module 401A-401E. The snow removal device 415 can also be positioned along the other (left in FIG. 4) longitudinal side of each solar module 401A-401E. In other examples, the snow removal device 415 is positioned along the shorter sides of each solar module 401A-401E. As shown in FIG. 4 the shorter side is along the top or the bottom of solar modules 401A-401E. If the snow removal device 415 is positioned along the bottom edge of the solar modules 401A-401E, then the snow removal device can include a gutter to direct water away from the remainder of the snow removal device 415 and/or direct the water to a drain and away from the solar module 401A, . . . , 401E, respectively. The controller can control operation of the snow removal device 415 using instructions received from a remote device or from weather information sensed at the location of the system 400. The controller can also control the electrical energy output of the system 400, e.g., up to one kilowatt and less than 15 amps.

Figure 5:
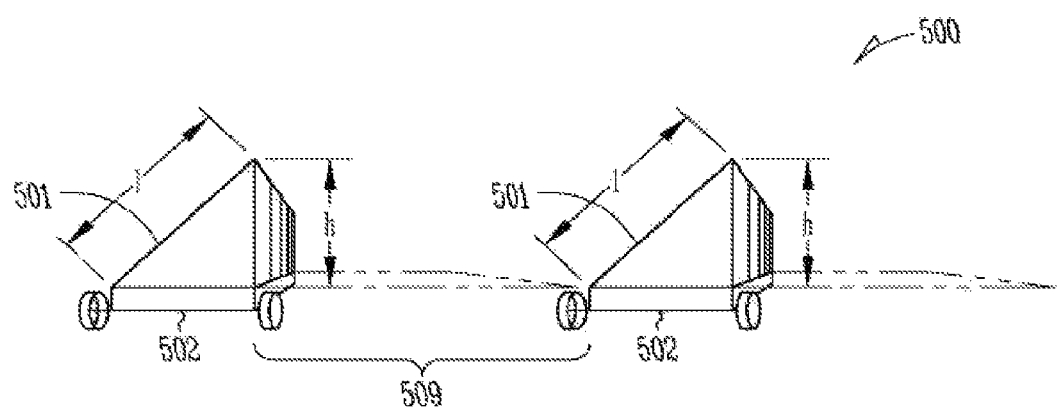
FIG. 5 depicts multiple solar units arranged in rows as an example of installation.

FIG. 5 shows an electrical power generation system 500 with a plurality of solar power systems that each include at least one module 501 mounted to a frame 502. The module 501 can include a plurality of individual solar modules, e.g., the modules 401A-401E shown in FIG. 4. The modules 501 can be positioned with the length l defining the face that the solar rays impinge to generate electricity. The face of the module 501 is positioned at an angle relative to the ground and, specifically, relative to the top surface of the frame 502. The rear edge of the face of the module 501 is raised to a height h to define the angle between the face and the ground to achieve an efficient receipt of solar rays to the front face of the module 501. As shown in FIG. 5, adjacent rows of modules 501 should spaced at a spacing distance 509 such that a module does not block solar rays to such an extent that efficiency of the rearward module is degraded by any significant extent. This is important in northern climates as the sun is lower in the sky during a larger portion of a day than in southern climates (relative to the northern hemisphere). In the illustrated example, it is desired that the sun rays are not blocked from reaching a subsequent solar module after 10 percent of the daily sunlight passes. Other examples can be less than 10 percent of the daily sunlight passes. With the solar modules having a face length l of about 63 inches with the rear edge raised to a height of 44 inches, the solar module will have a shadow length of about 108 inches when the solar modules are positioned at St Paul, Minn. (approximately latitude 45 degrees, longitude 93.degrees) at about noon on 21 Dec. 2010. The shadow will be slightly increased with the solar modules being mounted on a frame. The solar module placement methods described herein will take into account the specific site for the solar modules, the position with reference to the longitude and latitude, desired peak energy producing days, and the desired energy consumptions days, to determine the layout of the solar modules to achieve maximum efficiency in view of these criteria. The size of the solar modules is also taken into account in the layout processes described in greater detail herein.

Figure 6:
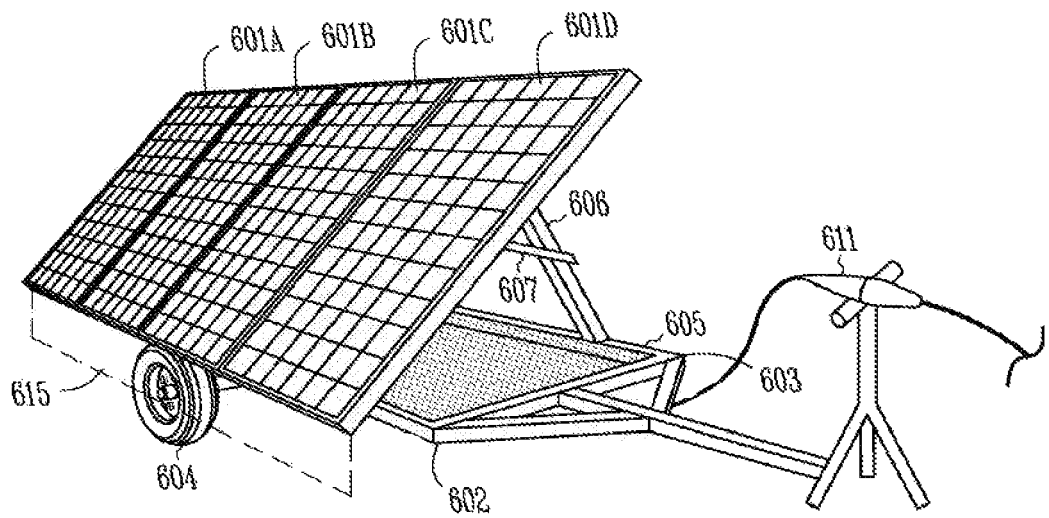
FIG. 6 depicts a perspective view of modular solar power source units mounted on a frame, according to some embodiments.
Figure 7:
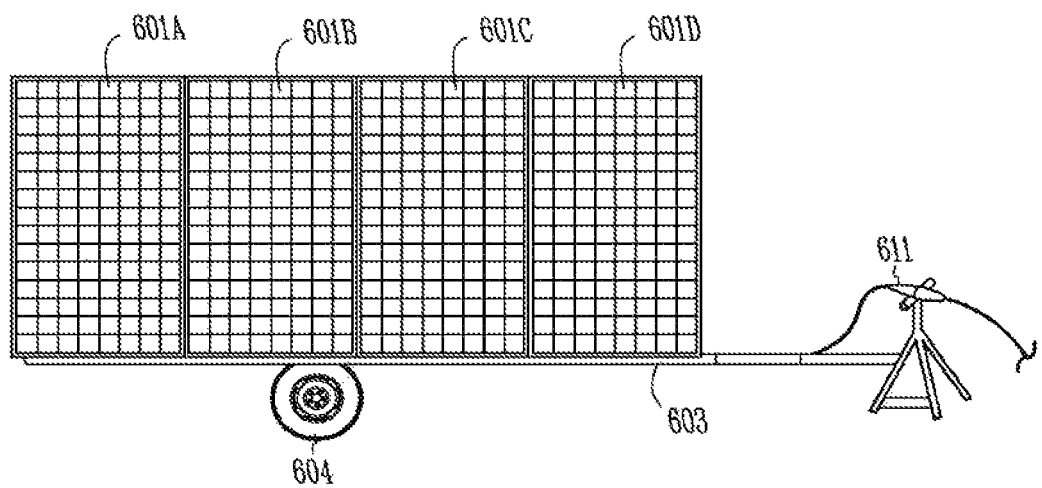
FIG. 7 depicts a front perspective view of modular solar power source units mounted on a frame, according to some embodiments.

Referring to FIG. 6, a perspective view of modular solar power source units mounted on a frame is shown (see FIG. 7 for a front view), according to some embodiments. Individual solar electrical power source units 601A-D can be mounted on a frame 602 in a position and angle to maximize exposure to the sun on a daily basis (dawn to dusk angle positioning), seasonal basis or both, for example. Each unit can comprise an electrical adaptor, such as a quick coupling adaptor 611. The frame 602 can be trailer or portable unit, such as by utilizing wheels 604. The frame 602 can be fixed in place by removing the wheels 604 or setting a lock mechanism on or near the wheels 604. In an example, the frame include leveling jacks (not shown), e.g., at each corner of the frame. The jacks can operate to level the frame or tilt the face of the power source units 601A-601D toward the sun. In a further example, the jacks lift the wheels off the ground to assist in at least semi-permanently fixing the position of the frame and, hence, the power source units 601A-601D.

A module can be an individual unit or group of units 615. Frame supports 606 and 607 position the units 601A-D at the desired angle. Frame bed 603 can be horizontally tiltable as well. The frame bed 603 can impart structural rigidity to the frame, either during operation, during transport or both. The frame bed 603 includes components that when connected together provide rigidity between the lateral side members of the frame and between the side and the front or rear support structures of the frame. Additionally, the frame bed 603 can support additional equipment, such as the tilting mechanism 605, for example. Other additional equipment can include satellite positioning, navigational devices (e.g., Global Positioning System devices), other disaster relief devices and supplies. A mechanism 605 for tilting the units 601A-D can be in mechanical contact with supports 606, 607.

Figure 8:
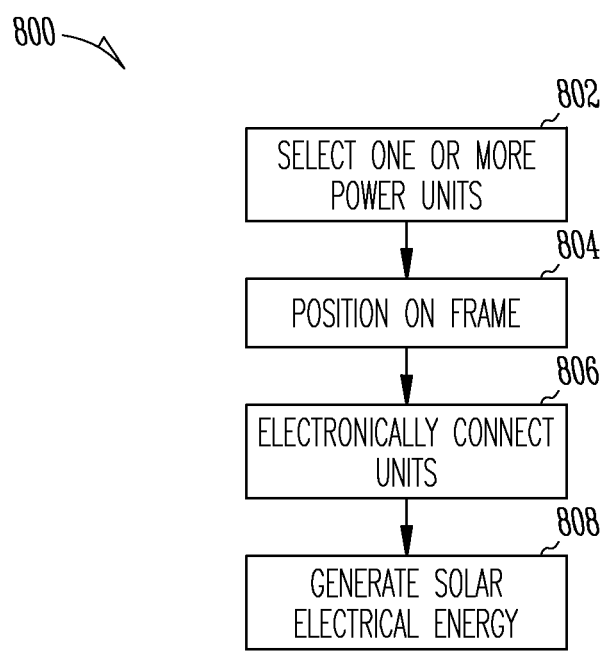
FIG. 8 depicts a flow diagram of a method of generating solar electrical power, according to some embodiments.

Referring to FIG. 8, a flow diagram 800 of a method of generating solar electrical power is shown, according to some embodiments. One or more prefabricated solar photovoltaic power source units are selected 802. The units are then positioned 804 on a moveable and adjustable frame. The units are electrically connected 806, for example with a quick coupling adaptor 611, to each other and to one or more of a utility grid, residence, commercial business or electrical storage device. Solar electrical energy is then generated 808 and distributed to one or more of a utility grid, residence, commercial business or electrical storage device.

Selecting 802 can include making a selection according to one or more of the following factors: cost, space, existing electrical support system, position relative to the sun and electrical needs of a facility. The number of units chosen can be initially determined by one or more of these factors. The positioning of the units can be used in selecting the units. As these factors change, one or more additional units or modules may be added to the system with little to no design or re-design costs and minimal installation required.

Selecting 802 can include requesting the quantity of power desired by the ordering customer, for example, over a computing network. Selecting can also include requesting the location of the installation site. The location can be input as a street address and then matched to a database that includes longitude and latitude data that corresponds to the input street address. The selecting process can further access a topographical map of the land at the proposed installation site. Such topographical data and longitudinal/latitudinal data can be stored in a local database in a memory accessible by a computing machine. The selecting can still further access visual images of the installation site, e.g., from GOOGLE™ street view or with satellite imagery. This data can be used in the position step, discussed below. If the selecting step determines that there may be an issue with the selection of the number of solar units as selected by the customer, based on any of this data, the selecting step can alert a person to review the order in essentially real-time, e.g., using electronic communication methods to communicate with the orderer who input information into the computing machine executing instructions for at least part of the selecting step, and remote from the installation site.

Selecting 802 can include determining available incentives for installation of solar energy producing devices and environmentally friendly energy production. The incentives can include rebates from manufacturers or tax incentives (e.g., tax credits) from local, state, of Federal governments. The various incentives can be stored in a database accessible to the order fulfillment computing devices and used to select the appropriate solar modules and devices for installation to maximize the incentives.

Positioning 804 can include mounting or attaching the units to the frame. Positioning 804 can also include adjusting an angle of the units in relation to the sun. The tiltable frame mechanism can adjust the units or modules for optimal sun exposure based on time or day, time of year or both.

In an example, positioning 804 can also include calculating in a computing machine, based on the type of the solar power generating unit, the layout of the solar power generating unit(s). The calculating can provide a layout scheme to an installer, who will be at the installation site. The installer need not be trained photovoltaic installer but need only be a technician with reasonable mechanical skills. The layout scheme will label the installation order of the solar power generating unit(s) and accessories. The layout scheme will further include the order of leveling and connection of the solar power generating unit(s) and initial testing of the solar power generating unit(s) as a complete install prior to brining the solar power generating unit(s) online with the building power system or the utility grid. If the installation scheme is for disaster relief efforts, then the layout scheme will include advise on checking for debris or flooding possibility and other possible on-site issues that should be reviewed prior to or while installation is being performed.

Electrically connecting 806 includes electrically connecting through an adapter, for example. Adapters can be quick couplings 611, outlets or electrical plugs. Adapters can be male or female depending on each unit's position in a series or string. In an example, the adapters can connect the solar devices in series or in parallel with an electrical storage device, which can include a capacitor or fuel cell or battery operated storage device.

Figure 9:
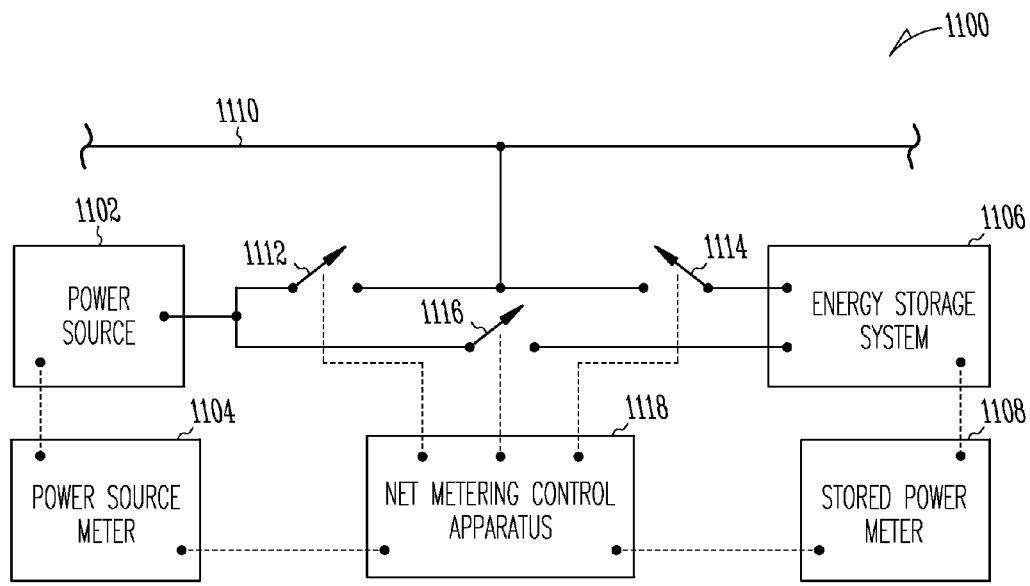
FIG. 9 depicts an electrical power generation unit formed, according to some embodiments.

FIG. 9 depicts an electrical power generation unit 1100 formed according to an embodiment (see U.S. Published Patent Application No. 2011/0077786, filed Sep. 28, 2009, having the same inventor as the present application, herein incorporated by reference in its entirety). The electrical power generation unit 1100 includes a power source 1102, for example one or more solar photovoltaic panels, and/or one or more wind turbines, capable of generating electrical power. A means for measuring the electrical power being generated by the power source 1102, depicted schematically in FIG. 9 as power source meter 1104, is coupled to the power source 1102. In one realization of the instant embodiment, the power source meter 1104 can be electromagnetically coupled to the power source 1102, for example through an air core transformer.

The electrical power generation unit 1100 also includes an energy storage system 1106, for example, a rechargeable battery, a flywheel, and/or a closed cycle fuel cell, capable of storing electrical power delivered to the energy storage system 1106 as stored energy. The energy storage system 1106 is capable of delivering the stored energy in the form of electrical power. In one realization of the instant embodiment, the energy storage system 1106 can have a maximum capacity for the stored energy. In an embodiment, the energy storage system 1106 is capable of delivering a desired amount of electrical power up to a stored energy delivery rate limit. A means for measuring an amount of the stored energy in the energy storage system 1106, depicted schematically in FIG. 9 as stored power meter 1108, is coupled to the energy storage system 1106.

Electrical power can be delivered from the power source 1102 to an electrical utility grid 1110, depicted schematically in FIG. 9 as electrical utility conductor 1110, through a generated power delivery switch 1112. The generated power delivery switch 1112 is capable of controlling an amount of electrical power from the power source 1102 delivered to the electrical utility grid 1110. In an embodiment, the generated power delivery switch 1112 can be capable of limiting the electrical power delivered to the electrical utility grid 1110 to a desired fraction of the power generated by the power source 1102. Electrical power can be delivered from the energy storage system 1106 to the electrical utility grid 1110 through a stored energy delivery switch 1114. The stored energy delivery switch 1114 is capable of controlling an amount of electrical power from the energy storage system 1106 delivered to the electrical utility grid 1110. In an embodiment, the stored energy delivery switch 1114 can be capable of limiting the electrical power delivered to the electrical utility grid 1110 to a desired fraction of the electrical power produced by the energy storage system 1106. Electrical power can be delivered from the power source 1102 to the energy storage system 1106 through a transfer switch 1116. The transfer switch 1116 is capable of controlling an amount of electrical power from the power source 1102 delivered to the energy storage system 1106. In an embodiment, the transfer switch 1116 may be capable of limiting the electrical power delivered to the energy storage system 106 to a desired fraction of the power generated by the power source 1102.

The electrical power generation unit 1100 further includes a net metering control apparatus 1118. The net metering control apparatus 1118 is coupled to the power source meter 1104, and is capable of reading a value of the power source meter 1104 representative of the amount of power being generated by the power source 1102. Similarly, the net metering control apparatus 1118 is coupled to the stored power meter 1108, and is capable of reading a value of the stored power meter 1108 representative of the energy stored in the energy storage system 1106. In an embodiment, the net metering control apparatus 1118 can be wirelessly coupled to the source meter 1104 and/or the stored power meter 1108. The net metering control apparatus 1118 is further coupled to the generated power delivery switch 1112, the stored energy delivery switch 1114 and the transfer switch 1116, and is configured to independently control the generated power delivery switch 112, the stored energy delivery switch 1114 and the transfer switch 1116. The net metering control apparatus 1118 is capable of adjusting the generated power delivery switch 1112, the stored energy delivery switch 1114 and the transfer switch 1116 based on the values read from the power source meter 1104 and the stored power meter 1108 so that a total amount of electrical power from the power source 1102 and the energy storage system 1106 to the electrical utility grid 1110 does not exceed a prescribed power limit. In an embodiment, the net metering control apparatus 1118 is capable of adjusting the transfer switch 1116 so that power generated by the power source 1102 above the prescribed power limit may be delivered to the energy storage system 1106. The net metering control apparatus 118 may incorporate computing circuitry, a computer or other electronic controller.

The net metering control apparatus 1118 can further include circuitry to monitor the electrical signals at the electrical utility grid 1110 supplied with electrical energy by either the stored and match the output electrical signal to the signal on the signal at the grid or load. The net metering control apparatus 1118 can further include circuitry to match the output signal to a load other than the grid 1110. The load can be an electrical motor, AC alternator, or other electricity user. In an example for North America, the sine wave signal local to the solar module or the net metering apparatus 1118, e.g., at grid 1110, switch 1112, switch 1114 or switch 1116 is sampled. The average frequency for this sine wave is 60 Hz. The output to the grid is matched to the sine wave. The circuitry can include a sniffer circuit that detects the phase and voltage of the signal on the grid. The circuitry can further include a reference oscillator circuit to actively control frequency and power output to achieve the desired line voltage and frequency to match the grid signal.

It will be recognized that the load on the grid may periodically change in frequency, current draw and/or voltage, the net metering apparatus 1118 can sense these changes and change the output signal to the grid. In another example, the grid is a DC load and the net metering apparatus 1118 will match the power needed but need not match the frequency. The net metering apparatus 1118 can also convert DC power stored in the energy storage system 1106 can be converted to an AC signal to match the signal on the grid 1110.

Figure 10:
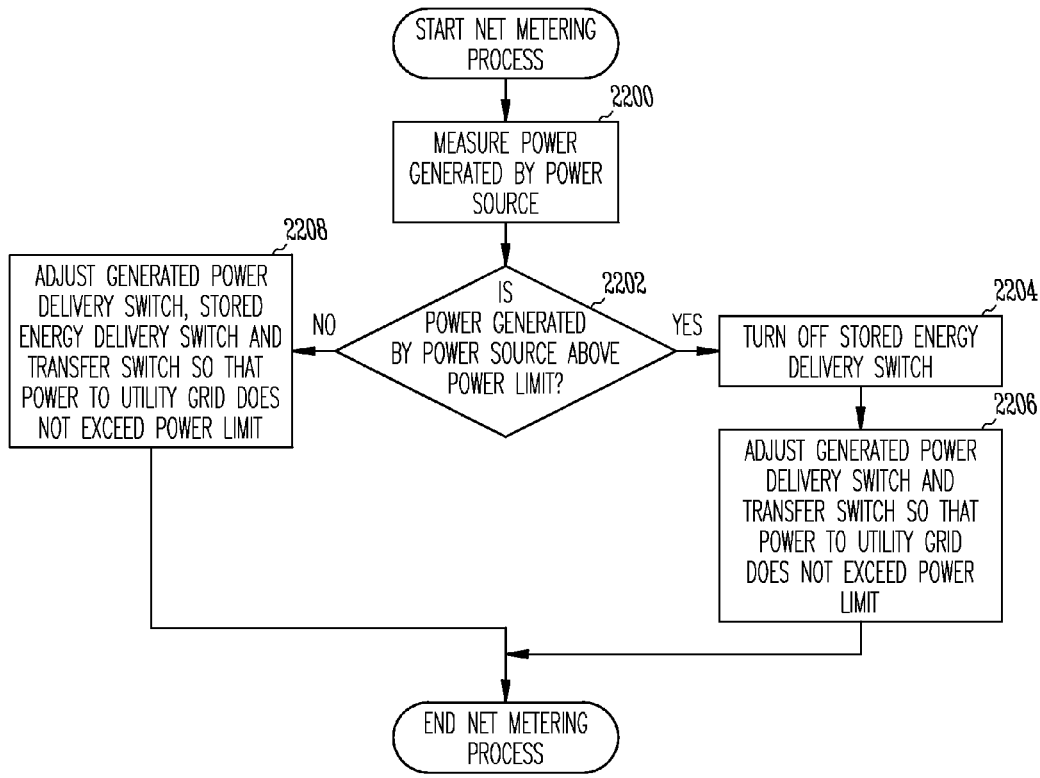
FIG. 10 depicts a flowchart of a net metering process for controlling electrical power flow in an electrical power generation unit, according to some embodiments.

FIG. 10 is flowchart of a net metering process for controlling electrical power flow in an electrical power generation unit as described in reference to FIG. 9. The net metering process begins with step 2200, reading the power source meter 1104 to obtain a value representative of the amount of electrical power being generated by the power source 1102. In an example, the reading is performed by the net metering apparatus 1118 (FIG. 9). At 2200, the signal at the load of the grid 1110 can be determined. At step 2202, it is determined if the amount of power being generated by the power source 1102 is above the prescribed power limit. In an embodiment, there may exist a lower reimbursement rate for electrical power delivered to the electrical utility grid 1110 above the prescribed power limit compared to power delivered below the prescribed limit.

If the result of step 2202 is yes, step 2204 is executed, which can, e.g., be performed at the net metering control apparatus 1118 to turn off the stored energy delivery switch 1114 if it is in an "ON" state. If the stored energy delivery switch 1114 is already in an "OFF" state, execution of step 2204 entails maintaining the stored energy delivery switch 114 in the OFF state.

Step 2206 is executed, which is the net metering control apparatus 1118 to adjust the generated power delivery switch 1112 and the transfer switch 1116 so that power delivered to the electrical utility grid 1110 does not exceed the prescribed power limit. In one realization of the instant embodiment, execution of step 2206 may include adjusting the transfer switch 1116 so that power from the power source 1102 above the prescribed power limit is delivered to the energy storage system 1106. In an example and at step 2206, the signal output from the solar power generation is matched to the electrical signal at the load or grid based on frequency. In alternate realizations of the instant embodiment, steps 2204 and 2206 may be executed in any order.

If the result of step 2202 is NO, step 2208 is executed, which is the net metering control apparatus 1118 to adjust the generated power delivery switch 1112, the stored energy delivery switch 1114 and the transfer switch 1116 so that total power from the power source 1102 and the energy storage system 1106 delivered to the electrical utility grid 1110 does not exceed the prescribed power limit. In one realization of the instant embodiment, execution of step 2208 may include turning off the transfer switch 116.

After step 2206 or step 2208 is executed, the net metering process is ended. The net metering process may be repeated as frequently as desired to obtain a desired level of performance from the electrical power generation unit 1100.

Figure 11:
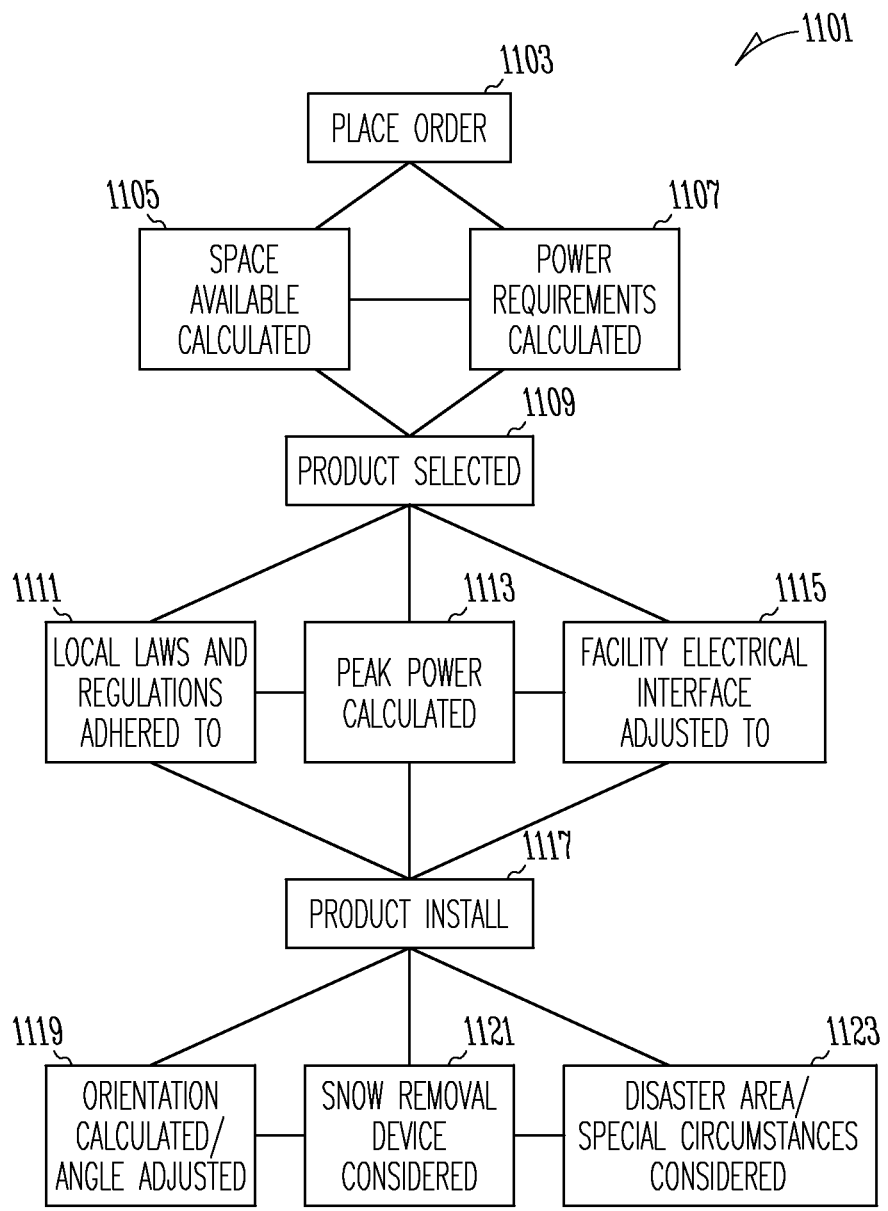
FIG. 11 depicts a block flow diagram of a method of an ordering system, according to some embodiments.

FIG. 11 depicts a system of ordering, according to some embodiments. A customer places 1103 an order via a webpage on the Internet, over the phone or in person. The customer supplies the amount of space available 1105, the power requirements 1107 or both. A product or number of units or modules is then selected 1109 based on the customer supplied information. Additionally, the product is selected 1109 in consideration of local laws or regulations 1111, peak power requirements 1113, existing electrical infrastructure at the facility or location 1115 or some combination of these factors are considered. A location consideration is whether to install a snow removal device (e.g., device 3115 of FIG. 3 or device 208 of FIG. 2), based on the average temperature and precipitation of the location site.

The product is then installed 1117 at the location according to an installation layout. Orientation 1119 of the units or modules is adjusted and snow removal device installed 1121 if desirable. If the location is a disaster site, 1123 many of the considerations and decisions may be made at the install site depending on the conditions and resources available. The installation layout can include a designation indicating the local for specific ones of the solar power, electricity generating units.

Figure 12:
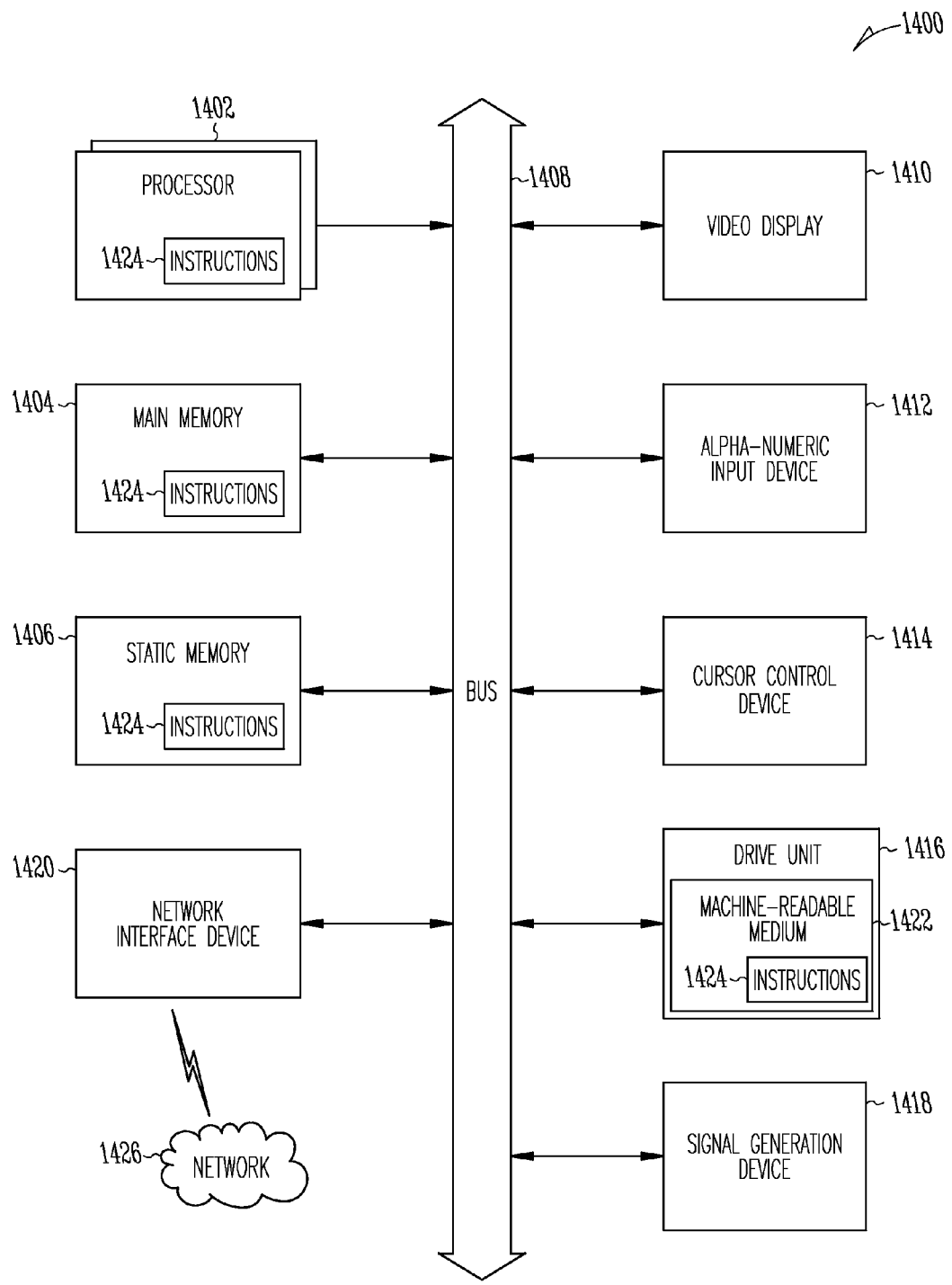
FIG. 12 depicts a system to interact with a solar unit according to some embodiments.

FIG. 12 shows a diagrammatic representation of a computing device for a machine in the example electronic form of a computer system 1400, within which a set of instructions for causing the machine to perform any one or more of the methodologies discussed herein can be executed. The computer system 1400 can be used to receive information about a proposed installation of solar energy units as described herein. The computer system 1400 can process these orders to determine an efficient installation layout and, if needed, determine the number of units and accessory equipment required for installation. In various example embodiments, the machine operates as a standalone device or can be connected (e.g., networked) to other machines. In a networked deployment, the machine can operate in the capacity of a server or a client machine in a server-client network environment, or as a peer machine in a peer-to-peer (or distributed) network environment. The machine can be a personal computer (PC), a tablet PC, a set-top box (STB), a Personal Digital Assistant (PDA), a cellular telephone, a portable music player (e.g., a portable hard drive audio device such as an Moving Picture Experts Group Audio Layer 3 (MP3) player, a web appliance, a network router, a switch, a bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1400 includes a processor or multiple processors 1402 (e.g., a central processing unit (CPU), a graphics processing unit (GPU), or both), and a main memory 1404 and a static memory 1406, which communicate with each other via a bus 1408. The computer system 1400 can further include a video display unit 1410 (e.g., a liquid crystal displays (LCD) or a cathode ray tube (CRT)). The computer system 1400 also includes an alphanumeric input device 1412 (e.g., a keyboard), a cursor control device 1414 (e.g., a mouse), a disk drive unit 1416, a signal generation device 1418 (e.g., a speaker) and a network interface device 1420.

The disk drive unit 1416 includes a computer-readable medium 1422 on which is stored one or more sets of instructions and data structures (e.g., instructions 1424) embodying or utilized by any one or more of the methodologies or functions described herein. The instructions 1424 can also reside, completely or at least partially, within the main memory 1404 and/or within the processors 1402 during execution thereof by the computer system 1400. The main memory 1404 and the processors 1402 also constitute machine-readable media.

The instructions 1424 can further be transmitted or received over a network 1426 via the network interface device 1420 utilizing any one of a number of well-known transfer protocols (e.g., Hyper Text Transfer Protocol (HTTP), CAN, Serial, or Modbus).

While the computer-readable medium 1422 is shown in an example embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media can also include, without limitation, hard disks, floppy disks, flash memory cards, digital video disks, random access memory (RAMs), read only memory (ROMs), and the like.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software programs for implementing the present method can be written in any number of suitable programming languages such as, for example, Hyper text Markup Language (HTML), Dynamic HTML, Extensible Markup Language (XML), Extensible Stylesheet Language (XSL), Document Style Semantics and Specification Language (DSSSL), Cascading Style Sheets (CSS), Synchronized Multimedia Integration Language (SMIL), Wireless Markup Language (WML), Java™, Jini™, C, C++, Perl, UNIX Shell, Visual Basic or Visual Basic Script, Virtual Reality Markup Language (VRML), ColdFusion™ or other compilers, assemblers, interpreters or other computer languages or platforms.

Figure 13:
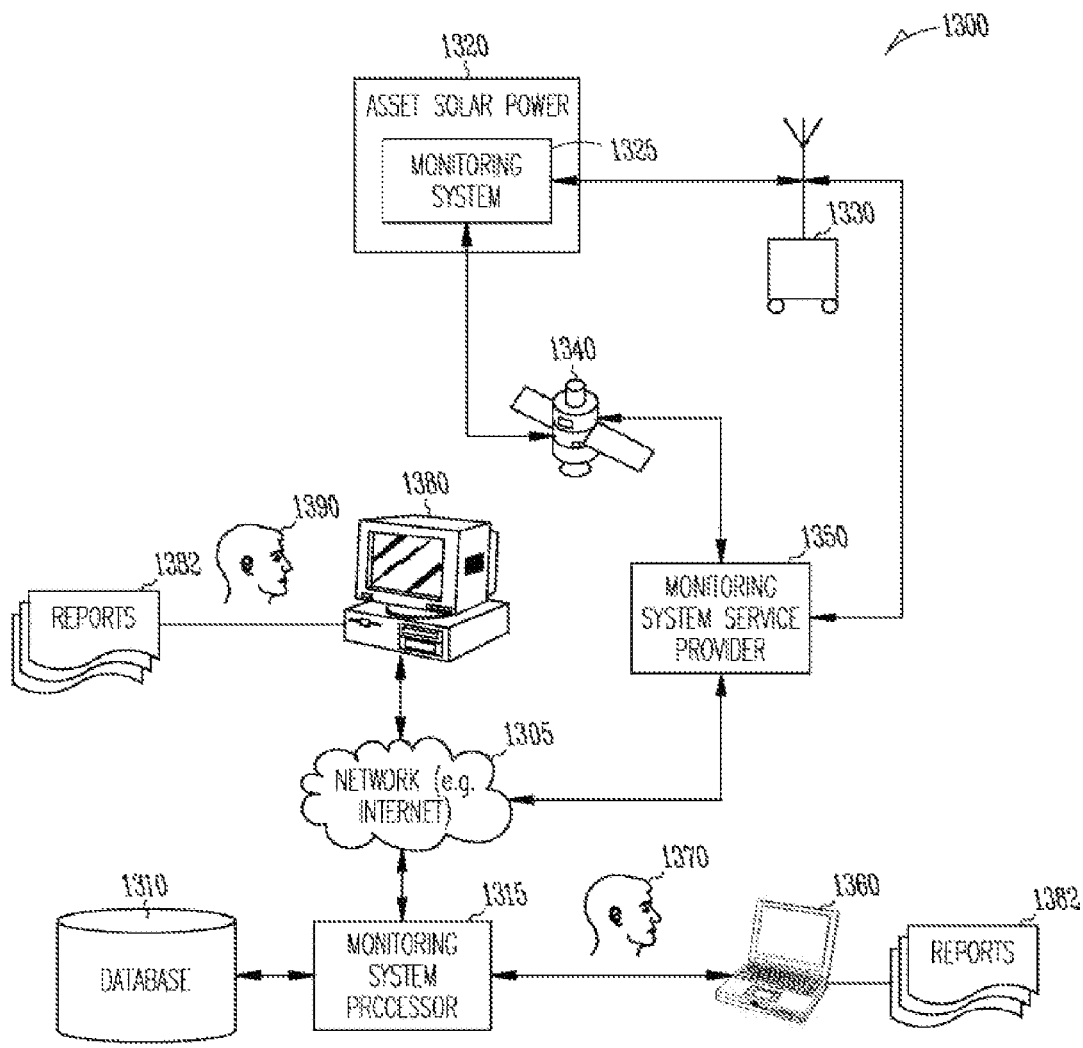
FIG. 13 depicts an architecture within which a solar electrical power source unit system is implemented, according to some embodiments.

FIG. 13 illustrates an example environment 1300, within which information reporting can be implemented. As shown in FIG. 13, the example environment 1300 comprises at least one solar power generating energy unit 1320, which can, in turn, include an installed monitoring system 1325. The monitoring system 1325 can collect, store, receive, (and possibly process) and transmit various information related to the solar generating energy unit 1325. The monitoring system 1325 can integrate a GPS transceiver, cellular/satellite transceiver, local wireless technology, and/or various computing technologies into a single data processing system. The monitoring system 1325 can sense weather conditions, sense events, sense operating data for the solar energy unit, send data and messages from the solar power energy unit 1320 to a monitoring system service provider 1350 running software specifically designed to process this type of information. The monitoring system 1325 can process information and make decisions on maintenance of the solar energy unit. The monitoring system 1325 can also receive messages sent from the monitoring system service provider 1350.

The environment 1300 can include a satellite network 1340 and/or a cellular network 1330, both of which can be utilized for transmitting and receiving operational data to and from the monitoring system 1325. The network 1330 can also be a short range wireless network used by computer systems. The satellite network 1330 and/or the cellular network 1330 can also receive and transmit the positional and operational data from a monitoring system service provider 1350. The monitoring system service provider 1350 can include dedicated circuitry or a general purpose computer configurable to make the information collected at the monitoring system 1325 available through an open architecture interface, such as an Application Programming Interface (API). The environment 1300 can also include a computer network or other electrical communication network 1305. The network 1305 can be a network of data processing nodes that are interconnected for the purpose of data communication (e.g., a global computer network, such as the Internet).

The monitoring system provider 1350 is communicatively coupled to the network 1305. A monitoring system processor 1315, illustrated within the environment 1300, can be communicatively coupled to the network 1305 as well. The monitoring system processor 1315 can be utilized to access and pull the positional and operational data associated with the solar energy unit(s) 1320 via the open architecture interface. Various communication protocols (e.g., Web Services) can be utilized in the communications occurring between the monitoring system processor 1315 and the monitoring system service provider 1350. The monitoring system service provider 1350 can utilize intelligent data processing as well as software to make the information available via the network 1305.

While as illustrated as two separated systems, in an example, the monitoring system provider 1350 and the monitoring system processor 1315 can be integrated and communication between the two systems occur as the unit 1320 is being monitored.

The monitoring system processor 1315 can be communicatively coupled to a database 1310, in which the monitoring system processor 1315 can periodically store results after processing of the information received from the monitoring system provider 1350. The monitoring system processor 1315 can include various modules, which can include hardware, software or combinations thereof. The modules of the monitoring system processor 1315 can be utilized to perform various operations discussed herein.

The monitoring system processor 1315 is optionally associated with an operator 1370 operating the monitoring system processor 1315 via a computer 1360. The computer 1360 can include a Graphical User Interface (GUI) facilitating display and manipulation of the monitoring system processor 1315. The computer 1360 can also enable the operator 1370 to view and manipulate reports 1382 that can be used to manage and monitor one or more of the solar energy units associated with the authorized user. The monitoring computer can be remote and the graphics being displayed can be over a computer network. The reports can relate to the solar energy unit usage, performance, efficiency, location of unit, position of the photovoltaic panel relative to the sun's path. The reports 1382 can include an electrical energy production report. The reports 1382 can include a weather report. The reports 1382 can also include a maintenance report. The maintenance report can include a record of the solar energy unit 1320 maintenance history.

The monitoring system processor 1315 can provide the reports 1382 to an authorized user 1390 via the network 1305. The authorized user 1390 can view the reports 1382 using a general purpose computer 1380 or any other device providing an ability to view the reports 1382. In some example embodiments, the monitoring system processor 1315 can send copies of the reports 1382 to the authorized user 1390 attached or embedded in a body of an electronic email. The reports 1382 are based on the information initially provided by the monitoring system 1325.

FIG. 13 shows a data communication system that couples the various devices together and can be used to control maintenance of solar energy units, snow removal operation, confirm installation data, and/or perform any of the methods or processes described herein. The network 1305 is a communication network, for example a global computer network, and in an example is preferably the Internet, but can be any network capable of communicating data between devices can be used with the present system. In addition to the Internet, suitable networks can also include or interface with any one or more of, for instance, an local intranet, a PAN (Personal Area Network), a LAN (Local Area Network), a WAN (Wide Area Network), a MAN (Metropolitan Area Network), a virtual private network (VPN), a storage area network (SAN), a frame relay connection, an Advanced Intelligent Network (AIN) connection, a synchronous optical network (SONET) connection, a digital T1, T3, E1 or E3 line, Digital Data Service (DDS) connection, DSL (Digital Subscriber Line) connection, an Ethernet connection, an ISDN (Integrated Services Digital Network) line, a dial-up port such as a V.90, V.34 or V.34bis analog modem connection, a cable modem, an ATM (Asynchronous Transfer Mode) connection, or an FDDI (Fiber Distributed Data Interface) or CDDI (Copper Distributed Data Interface) connection. Furthermore, communications can also include links to any of a variety of wireless networks, including WAP (Wireless Application Protocol), GPRS (General Packet Radio Service), GSM (Global System for Mobile Communication), CDMA (Code Division Multiple Access) or TDMA (Time Division Multiple Access), cellular phone networks, GPS (Global Positioning System), CDPD (cellular digital packet data), RIM (Research in Motion, Limited) duplex paging network, Bluetooth radio, or an IEEE 802.11-based radio frequency network. The network 110 can further include or interface with any one or more of an RS-232 serial connection, an IEEE-1394 (Firewire) connection, a Fiber Channel connection, an IrDA (infrared) port, a SCSI (Small Computer Systems Interface) connection, a USB (Universal Serial Bus) connection or other wired or wireless, digital or analog interface or connection, mesh or Digi® networking.

The above disclosure refers to position navigation systems and Global Positioning System (GPS). It is within the scope of the present invention to use other types of navigational positioning systems. Other systems can include Beidou, COMPASS, Galileo, GLONASS, Indian Regional Navigational Satellite System (IRNSS), or QZSS. Moreover, these systems can use Real Time Kinematic (RTK) satellite navigation to provide the real-time corrections of the positioning signal down to a meter or centimeter level of accuracy. The systems can also use differential correction signals in North American from the FAA's WAAS satellites. Accordingly, references herein solely to GPS should be read to as general position navigation systems.

Examples as described herein can provide an improved method and system to provide electricity from solar energy. The standardization of the individual modules (e.g., solar units) simplifies the installation and can provide automated layouts that can be efficiently installed. The individual modules can be less than three models. In an example, there is only one module that has a controller, which can operate as an interconnect between other like modules and at least one controller operates as an interface to the external circuitry, e.g., utility grid or site electrical systems.

The controller as described herein matches the output from the solar energy units to the load. The controller can match the output to a split phase, 3 phase (208 volt 480 volt, or 277 volt), 120 Volt/single phase, or switching between any of these power forms. Other power forms can also be sensed and matched.

The present disclosure shows a modular, portable solar energy unit that is mounted to a frame. The units are standardized so that installation is easy. The frame can be mounted on wheels that allow the unit to move. In a further example, the frame, and hence the solar unit, can be delivered on a truck bed in a manner similar to that shown in US Patent Application Publication No. 2011/0132353 titled TRANSPORTABLE MULTI-CONFIGURABLE SELF-BALLASTED MODULAR SOLAR POWER UNIT, which is hereby incorporated by reference unless the incorporation by reference conflicts with the present explicit disclosure herein. In various examples, any such power unit would include various features disclosed herein, including but not limited to a controller and the ability to plug and play, e.g., connect and deploy, a plurality of solar power units in daisy chain configuration with one connection from the plurality of solar power units to the grid power or the building power.

Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A solar electrical power generation device, comprising: one or more prefabricated solar photovoltaic power source units, each unit including an adapter to electrically connect to other units in series, in parallel, or both; and a moveable frame comprising a tilting mechanism and supporting at least one of the one or more prefabricated solar photovoltaic power source units; wherein the adaptor of at least one unit comprises a quick coupling adaptor, wherein the frame is moveable from between sites and within a site and adjustable to increase or decrease a unit angle in relation to the sun, and wherein the device being capable of connecting to a utility grid or serving as a stand-alone electrical power system.

2. The solar electrical power generation device of claim 1, further comprising a snow removal device.

3. The solar electrical power generation device of claim 1, further comprising an inverter.

4. The solar electrical power generation device of claim 1, further comprising one or more controllers capable of sensing and controlling individual unit power output.

5. The solar electrical power generation device of claim 1, wherein the device is capable of generating electrical power along with auxiliary power generation to simulate a grid connection.

6. The solar electrical power generation device of claim 1, further comprising an electrical storage device being capable of storing electrical power generated from the one or more power source units.

7. The solar electrical power generation device of claim 1 wherein the frame further comprises wheels, wherein the wheels are lockable and/or removable.

8. A solar power module system, comprising: two or more solar power modules; each module including: a prefabricated solar photovoltaic power source unit; an electrical adapter capable of electrically connecting to other units in series, in parallel, or both; and one or more controllers; wherein each module being capable of independently generating solar electrical energy and distributing the energy to a utility grid or as a stand-alone system, wherein the electrical adaptor of at least one module comprises a quick coupling adaptor.

9. The solar power module system of claim 8, wherein the electrical adapter of at least one module includes an inverter.

10. The solar power module system of claim 9, wherein the inverter outputs an electrical signal that simulates a grid connection.

11. The solar power module system of claim 8, further comprising a frame, supporting at least one unit.

12. The solar power module system of claim 8, further comprising a snow removal device.

13. A method for generating solar electrical power, comprising: selecting one or more prefabricated solar photovoltaic power source units, wherein selecting includes making a selection according to one or more of cost, space, existing electrical support system, position relative to the sun and electrical needs of a facility; positioning the one or more prefabricated solar photovoltaic power source units on a moveable and adjustable frame, wherein positioning includes adjusting a tilt angle of a photovoltaic panel on the prefabricated solar photovoltaic power source units; electrically connecting the one or more prefabricated solar photovoltaic power source units to one or more of a utility grid, residence, commercial business or electrical storage device; and generating solar electrical energy and distributing the energy to one or more of a utility grid, residence, commercial business or electrical storage device, wherein electrically connecting comprises electrically connecting through a quick coupling adapter that can plug and unplug from a mating adapter.

14. The method of claim 13, wherein positioning includes mounting or attaching the units to a foundation at an installation site.

15. The method of claim 13, wherein positioning comprises adjusting an angle of the units in relation to the sun.

16. The method of claim 13, wherein electrical storage device comprises a capacitor or fuel cell or battery operated storage device.

17. The method of claim 13, further comprising transporting the frame with the power source unit mounted thereon to an installation site.

* * * * *